United States Patent
Zakel

(10) Patent No.: US 7,007,834 B2
(45) Date of Patent: Mar. 7, 2006

(54) CONTACT BUMP CONSTRUCTION FOR THE PRODUCTION OF A CONNECTOR CONSTRUCTION FOR SUBSTRATE CONNECTING SURFACES

(75) Inventor: Elke Zakel, Falkensee (DE)

(73) Assignee: PAC Tech—Packaging Technologies GmbH, Nauen (DE)

( * ) Notice: Subject to any disclaimer, the term of this patent is extended or adjusted under 35 U.S.C. 154(b) by 86 days.

(21) Appl. No.: 10/451,319

(22) PCT Filed: Dec. 19, 2001

(86) PCT No.: PCT/DE01/04774

§ 371 (c)(1),
(2), (4) Date: Jun. 19, 2003

(87) PCT Pub. No.: WO02/50889

PCT Pub. Date: Jun. 27, 2002

(65) Prior Publication Data

US 2004/0051116 A1    Mar. 18, 2004

(30) Foreign Application Priority Data

Dec. 20, 2000 (DE) .............................. 100 63 914

(51) Int. Cl.
  B23K 31/02  (2006.01)
(52) U.S. Cl. ................................. 228/56.3
(58) Field of Classification Search ........... 228/245, 228/246, 180.22; 257/737, 738; 438/613
See application file for complete search history.

(56) References Cited

U.S. PATENT DOCUMENTS

| | | | |
|---|---|---|---|
| 4,740,700 A | 4/1988 | Shaham et al. | |
| 5,461,261 A | 10/1995 | Nishiguchi | |
| 5,477,087 A | 12/1995 | Kawakita et al. | |
| 5,684,677 A * | 11/1997 | Uchida et al. | 361/770 |
| 5,868,304 A * | 2/1999 | Brofman et al. | 228/254 |
| 6,007,349 A | 12/1999 | Distefano et al. | |
| 6,028,011 A | 2/2000 | Takase et al. | |
| 6,103,624 A | 8/2000 | Nogami et al. | |
| 6,169,021 B1 * | 1/2001 | Akram et al. | 438/612 |
| 6,253,986 B1 * | 7/2001 | Brofman et al. | 228/56.3 |
| 6,268,660 B1 * | 7/2001 | Dhong et al. | 257/774 |
| 6,278,184 B1 * | 8/2001 | Brofman et al. | 257/737 |
| 6,426,556 B1 * | 7/2002 | Lin | 257/738 |
| 6,555,908 B1 * | 4/2003 | Eichelberger et al. | 257/737 |
| 6,818,544 B1 * | 11/2004 | Eichelberger et al. | 438/613 |
| 2002/0105076 A1 * | 8/2002 | Lin | 257/738 |
| 2003/0201534 A1 * | 10/2003 | Eichelberger et al. | 257/737 |

FOREIGN PATENT DOCUMENTS

DE  26 24 292 A1  12/1976

(Continued)

OTHER PUBLICATIONS

Rolf Aschenbrenner et al.; "Electroless Nickel/Copper Plating as a New Bump Metallization"; IEEE Transactions on Components . . . ; 1995; all pages; Part 2, vol. 18, No. 2.

(Continued)

Primary Examiner—Jonathan Johnson
(74) Attorney, Agent, or Firm—Adams Evans P.A.

(57) ABSTRACT

Contact bump construction (27) and method for the production of a contact bump construction for the formation of elevated contact sites on connecting surfaces (22) of a substrate (21), particularly chip connecting surfaces, with a spacer metallization (28) for the attainment of a defined height of the contact bump construction, wherein the spacer metallization (28) consists at least partly of annealed copper.

7 Claims, 4 Drawing Sheets

FOREIGN PATENT DOCUMENTS

| | | |
|---|---|---|
| EP | 0 295 914 A2 | 12/1988 |
| EP | 0 308 971 A2 | 3/1989 |
| EP | 0 818 812 A1 | 1/1998 |
| EP | 0 827 190 A2 | 3/1998 |
| JP | 61 012 047 A | 1/1986 |
| JP | 01 007 542 A | 1/1989 |
| JP | 05 243 231 A | 9/1993 |
| JP | 05 251 455 A | 9/1993 |
| JP | 10125725 A * | 5/1998 |
| JP | 11330165 A * | 11/1999 |
| WO | WO 97/00338 | 1/1997 |
| WO | WO 00/57469 | 9/2000 |
| WO | WO 00/79589 A1 | 12/2000 |
| WO | WO 02/050889 | 6/2002 |

OTHER PUBLICATIONS

IBM Corp.; "Direct Chip Bonding with Bump on Substrate"; IBM Technical Disclosure Bulletin; 1990; pp 476-477; vol. 32, No. 10B; IBM Corp.

* cited by examiner

CONTACT BUMP CONSTRUCTION FOR THE PRODUCTION OF A CONNECTOR CONSTRUCTION FOR SUBSTRATE CONNECTING SURFACES

This is a national phase application of International Application PCT/DE01/04774, filed Dec. 19, 2001, and claims priority to German Patent Application No. 100 63 914.3, filed Dec. 20, 2000.

The invention relates to a contact bump construction for the formation of elevated contact sites on connecting surfaces of a substrate, particularly chip connecting surfaces, in accordance with the preamble of claims 1 and 10, and a bonding configuration between connecting surfaces of substrates contacted by the use of the bump construction in accordance with claims 4 and 18.

Particularly for producing contacts between chips in the "flip-chip" method, and for producing contacts on relatively large area substrates having a connecting surface distribution frequently realized as an area array, for example a ball grid array, a direct contacting method has gained general acceptance in which elevated contact metallizations, known by the technical term "bumps", are used to create a bond of opposing connecting surfaces of substrates that are to be brought into contact with each other. As the density of such connecting surfaces increases, the requirements also become more stringent for a method of compensating tolerance that compensates both for the positional deviations of the mutually assigned connecting surfaces of the substrates and also height differences of the bumps forming the contacts, in order to prevent faulty contact or to minimize as far as possible the mechanical stresses in the electronic components that impair the operating reliability of the components.

The object of this invention, therefore, is to suggest a bump construction that enables tolerance compensation with respect to height differences of the bumps and positional deviations of the connecting surfaces that are to be brought into contact with each other.

This object is achieved by a bump configuration having the characteristics of claim 1.

In accordance with the first solution described above of the object underlying the invention, the bump construction according to the invention is furnished with a spacer metallization that consists at least in part of annealed copper, provided on the connecting surfaces of the substrate in order to reach a defined height of the bump configuration.

Within the terms of the solution according to the invention, a bump construction is thus provided having a metallic structure made from copper, wherein the copper structure has a relatively coarse "re-crystallization structure" as a consequence of annealing, i.e. heat treatment, which overall lends flexibility to the bump construction under compression loading. In this way, even a multiplicity of bumps arranged in distributed manner on a contact side of a substrate, and having varying heights in their original condition due to the unavoidable height tolerance intrinsic to a manufacturing process, caused by contact pressure upon contacting with another substrate, may be compressed together to a uniform dimension. Thus it is possible in large measure to preclude faulty contact sites due to differing contact heights of individual bumps or component tensions arising from the contacting process.

For the case of inadequate adhesion due to material pairing between the spacer metallization made from copper and the connecting surface metallization of the substrate, an intermediate metallization may be provided for the indirect bonding of the spacer metallization to the connecting surface. This is then especially advantageous if the intermediate metallization, unlike the spacer metallization, is not made from copper, but from aluminum for example. For the intermediate metallization, the use of a Ni—Au layer construction on the connecting surface metallization or the deposit of a Ni/Au alloy on the connecting surface metallization has been proven to be advantageous.

It is especially advantageous if the intermediate metallization or also the spacer metallization is an electroless deposit. The result of electroless copper deposition with subsequent annealing is a plasticly deformable bump, free of internal stresses, "low stress electroless bump".

In order to increase reliability using the bump configuration according to the invention, it has proven to be advantageous if the spacer metallization is provided with a coating serving as an oxidation barrier. Such a coating may be for example a Ni/Au, Sn, or Sn/Pb alloy.

A bonding configuration between connecting surfaces of mutually contacted substrates that is selected using the bump construction according to the invention has a spacer metallization arranged on a connecting surface of a first substrate which consists at least in part of annealed copper.

The bonding configuration may be produced with known thermal compression procedures, for example, or also bonding techniques particularly with a non-conductive adhesive, i.e. techniques in which it is not absolutely necessary to employ an additional bonding substance.

However, it is also possible to provide a bonding substance between the spacer metallization and an assigned connecting surface of a second substrate.

According to a particularly preferred embodiment, the bonding substance that is used in the production of a substance-enclosing, electrically conductive bond between the spacer metallization arranged on the connecting surface of the first substrate and the assigned connecting surface of the second substrate, consists of an anisotropic bonding material. The combination of the anisotropic adhesive material as bonding substance with the spacer metallization made from annealed copper enables—particularly because of the relatively good plastic deformability of the annealed copper—the particular advantage of a contacting of the two substrates without significant thermal stress and consequently without any possible effect on the crystallization structure of the spacer metallization. Moreover, the desired leveling of the heights of the spacer metallizations for a multiplicity of bumps arranged in a shared contact plane takes place simultaneously with the compressive load necessary for the production of a conductive contact.

In all cases, however, the bonding configuration according to the invention also allows the use of a soldering material as bonding substance.

As was indicated previously with reference to the contact bump construction according to the invention, corresponding advantages also become evident for the bonding configuration with the arrangement of an oxidation barrier on the spacer metallization and/or arrangement of an intermediate metallization for indirect bonding of the spacer metallization to the connecting surface.

In the method for the production of a contact bump construction according to the invention on connecting surfaces of substrates, in which copper is deposited by electroless means on the connecting surfaces or on an intermediate metallization arranged on the connecting surfaces to form a spacer metallization, the terms of the invention provide for a process step carried out following the deposition process in which the deposited copper is re-crystallized by exposure to heat to a temperature above the temperature of the deposition process.

With the subsequent heat treatment of the copper previously deposited by electroless means for example at a temperature of approximately 60° C., the copper is re-crystallized at a temperature preferably >100° C. This conversion of a structure that is somewhat amorphous due to the deposition process into a comparatively coarsely crystalline structure causes a reduction in hardness of the copper structure with a consequential increase in the plastic deformability of the copper.

According to a further solution of the task underlying the invention, a contact bump construction is suggested for the formation of elevated contact sites on connecting surfaces of a substrate in accordance with claim 10, which has a spacer body made from a dielectric, whose at least partially electrically conductive surface is connected to the assigned connecting surface of the substrate via an electrical conductor, wherein the conductor is conformed at least partly as a surface conductor arranged on the surface of the spacer body.

The combination according to the invention of non-conductive spacer body and surface conductor for the electrically conductive contacting of the surface of the spacer body with the connecting surface of the substrate allows the connecting surfaces to be re-distributed and/or enlarged very simply without the formerly usual multi-layer construction layering on the contact side of a substrate.

With the bump construction according to the invention, deviations in the regular surface-distribution of the connecting surfaces, known as "pitch errors", may be compensated so that a reliable contact between substrates is possible even if such deviations are present.

If the spacer body is arranged in a covering position relative to the assigned connecting surface, an electrically conductive contact surface of the spacer body with electrically conductive bonding to the connecting surface of the substrate may be created by means of a partial formation of the conductor as a through-hole contact, which extends through a hole in the spacer body.

According to a further embodiment, the spacer body may also be arranged with the conductor interposed on the connecting surface, and the conductor may extend around at least a part of the perimeter of the spacer body as far as the top side of the spacer body.

If the spacer body is arranged with a partial area on a first partial surface of the connecting surface and moreover extends beyond the connecting surface, while the conductor of a second partial surface of the connecting surface extends as far as the top surface of the spacer body, a re-bonding or re-distribution of the effective connecting surfaces, may be realized in particularly simple manner.

In order to achieve a connection that is permanently electrically reliable between the connecting surface and the electrically conductive upper side of the non-conductive spacer body, it has proven advantageous if the conductor at least in the areas beyond the connecting surface is furnished with a bonding agent layer as a carrier for a contact metallization of the conductor.

Such a bonding agent layer may be formed for example if the corresponding surface areas of the electrically non-conductive surface, that is to say for example the chip passivation, is seeded with palladium so that on the one hand deposition onto non-metallic surfaces is also possible by reason of the low selectivity of palladium, and on the other hand deposited palladium particles may be used as seeds for a subsequent metal deposition of copper or a Cu/Ni-alloy for example.

In order to strengthen the adhesion between the conductor and the connecting surface and/or the surface of the spacer body, the connecting surface may be provided with a contact metallization containing Ni and Au.

A bonding configuration produced with the use of the contact bump construction according to the invention between connecting surfaces of contacted substrates has in accordance with the invention a spacer body arranged on a connecting surface of a first substrate to achieve a defined height of the bonding configuration, and a bonding substance arranged between the spacer body and an assigned connecting surface of a second substrate, wherein the spacer body consists of a dielectric, whose at least partly electrically conductive surface is connected with the connecting surface of the first substrate via an electrical conductor.

Depending on the form taken by the spacer bodies, the bonding configuration according to the invention not only enables compensation of pitch errors in a bond between two substrates, but also a relative enlargement of the connecting surfaces and/or re-distribution of the connecting surfaces.

Particularly the enlargement of the connecting surfaces thus enabled makes possible a preferred use of an anisotropic adhesive material as a bonding substance.

In the following, preferred embodiments of a contact bump construction and bonding configurations created using such contact bump constructions are explained in detail with reference to the drawings.

BRIEF DESCRIPTION OF THE DRAWINGS

FIG. 1 shows a connecting surface area 20 of a substrate 21 with in the present case a connecting surface 22 made from aluminum that is furnished with a two-layer intermediate metallization 23 including a layer of nickel 24 and a layer of gold 25. With the exception of the connecting surface area 20, the substrate 21, for example a chip, is provided with a so-called "passivation" 26.

Figure 1:
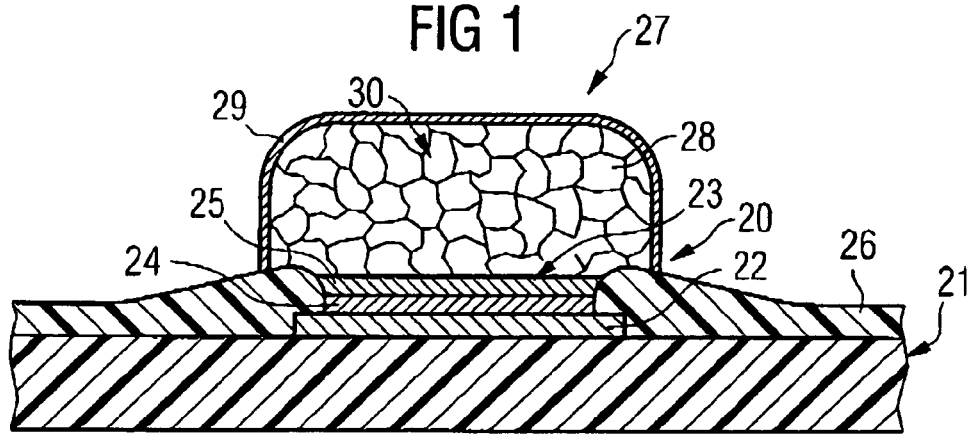
FIG. 1 shows a first embodiment of a contact bump construction with intermediate metallization.

In the embodiment shown in FIG. 1 in order to create a contact bump construction 27 on the connecting surface 22, the intermediate metallization 23 is furnished with a spacer metallization 28 made from copper. On its surface, the spacer metallization 28 is furnished with a coating 29 which may be made for example from gold, a nickel/gold alloy, tin or a tin/lead alloy to prevent surface oxidation. The coating 29 may serve particularly to smooth micro-roughnesses on the surface of spacer metallization 28.

As indicated in FIG. 1, the spacer metallization 28 made from copper has a relatively coarse, crystalline grain structure, which is the result of a heat treatment following arrangement of the spacer metallization 28 on the intermediate metallization 23. In order to arrange the spacer metallization 28, copper is deposited by electroless means on the intermediate metallization 23 following electroless deposition of nickel and gold on the connecting surface 22 to form the intermediate metallization 23. Nickel and gold are deposited to achieve layer thicknesses for example from 5 to 20 micrometers and from 0.1 to 0.5 micrometers respectively. In particular the chemical process of copper deposition is performed at a temperature below 100° C., for example about 60° C. The result of the electroless deposition process is a copper layer having a practically amorphous structure. By subsequent heat treatment at a temperature >100° C. the copper structure is re-crystallized with a comparatively coarse, crystalline structure as a result, which presents evident hardness reduction compared with the initial structure.

Figure 2:
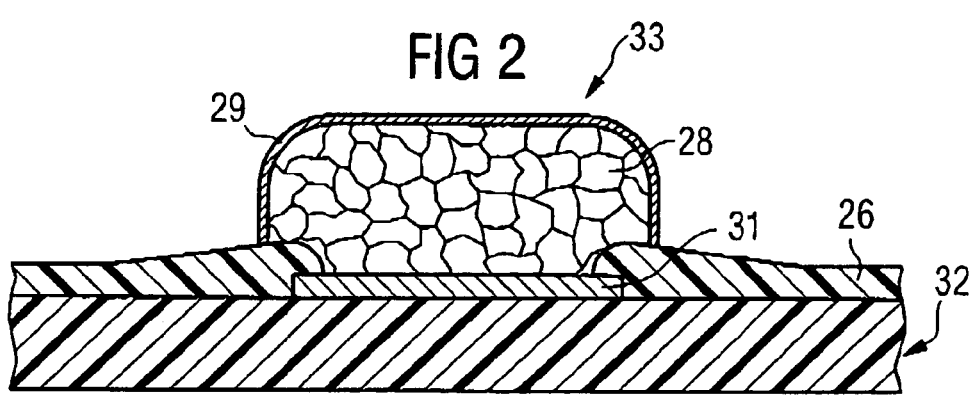
FIG. 2 shows a second embodiment of a contact bump construction without intermediate metallization.

FIG. 2 shows a contact bump construction 33 formed on a connecting surface 31 of a substrate 32, in which the spacer metallization 28 is applied directly, that is without intermediate metallization 23, to the connecting surface 31 by electroless copper deposition.

Figure 3:
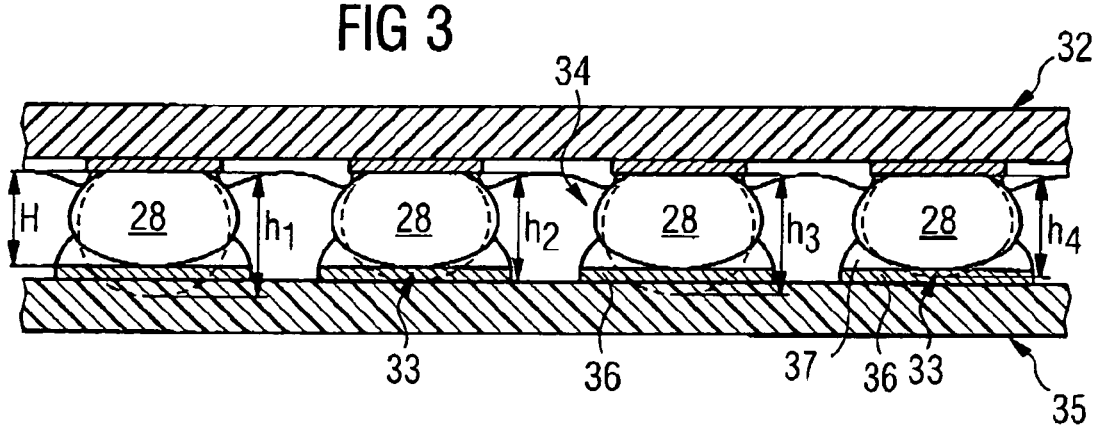
FIG. 3 shows a bonding configuration between two substrates using the contact bump construction represented in FIG. 2.

FIG. 3 shows a bonding configuration 34 between two substrates 32 and 35 using contact bump constructions 33, as shown in FIG. 2. In order to create the contact shown in FIG. 3 the substrate 35 assigned with connecting surfaces 36 is first provided, and the connecting surfaces 36 are furnished with a bonding substance of anisotropic adhesive 37.

The substrate 32 provided with contact bump constructions 33 is contacted by the "flip-chip" technique, wherein the substrate 32 with contact bump constructions 33 aligned towards the connecting surfaces 36 of the substrate 35 is brought into contact with the connecting surfaces 36 and pressed against them with a defined compressive force.

This creates an electrically conductive contact of the contact bump constructions 33 with the connecting surfaces 36 through the conductive particles arranged in the anisotropic adhesive 37, and a plastic deformation of the spacer metallizations 28 of the contact bump constructions 33 takes place such that the different heights $h_1$ to $h_4$ of the contact bump constructions 33 in the originally unloaded condition (dashed line) are deformed until a uniform height H of the bump constructions 33 is achieved. Consequently, from all the bonding configurations formed between the substrates 32 and 35, there is created a reliable mechanical and electrical contact having uniform contact height, with an arrangement of the substrates 32 and 35 that is essentially parallel and free from body stresses.

Figure 4:
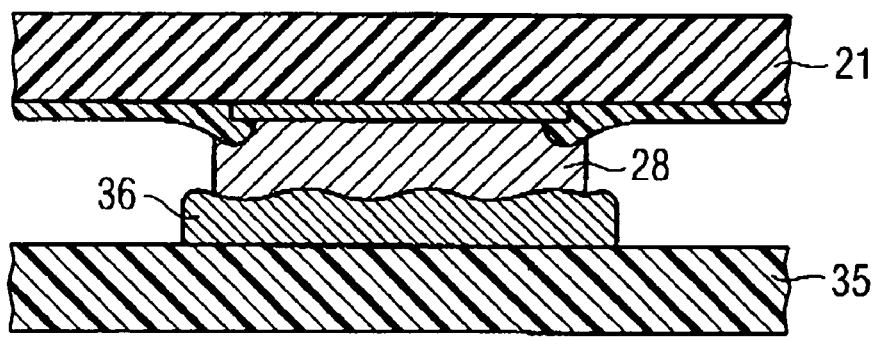
FIG. 4 shows an enlarged detail of a bonding configuration.

The plastic deformation of the spacer metallizations 28 during flip-chip contacting also enables the surface contour of the spacer metallizations 28 to be conformed to the surface contour of the connecting surfaces 36, as shown in exemplary manner in FIG. 4. The extensive surface contact made possible hereby is particularly advantageous in conjunction with bonding techniques in which no bonding material is used between the contact partners to even out the deviations in the surface contours of the contact partners, such as for example in the thermal compression method or a compound with non-conductive adhesive, in which the adhesive is essentially arranged on the periphery of the bonding configuration.

FIGS. 5 to 8 thereafter show the production of a contact bump construction 38 in the connecting surface area 39 of a substrate 40.

Figure 5:
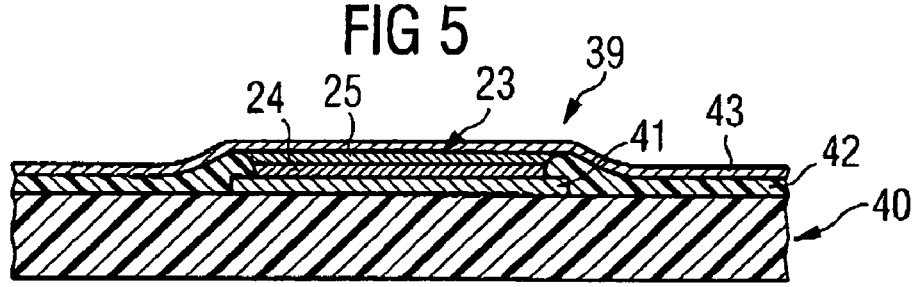
FIG. 5 shows a connecting surface area of a substrate with intermediate metallization and surface-conductor layer.

FIG. 5 shows the connecting surface area 39 having a connecting surface 41 and a surface of the substrate 40 insulated by a passivation 42, with exception of the connecting surface surface 41. In the present case, the connecting surface 41 is made from aluminum and is furnished with an intermediate metallization 23 including a layer of nickel 24 and a layer of gold 25. The entire connecting surface area 39 is covered with a surface conductor layer 43 as surface conductor, which in the present case has a contact metallization consisting of a copper/nickel-alloy on a carrier preferably containing palladium. If required, the carrier may serve to assure the desired adhesion between the contact metallization of the surface conductor layer 43 and a non-metallic base, which is to say the passivation 42.

Figure 6:
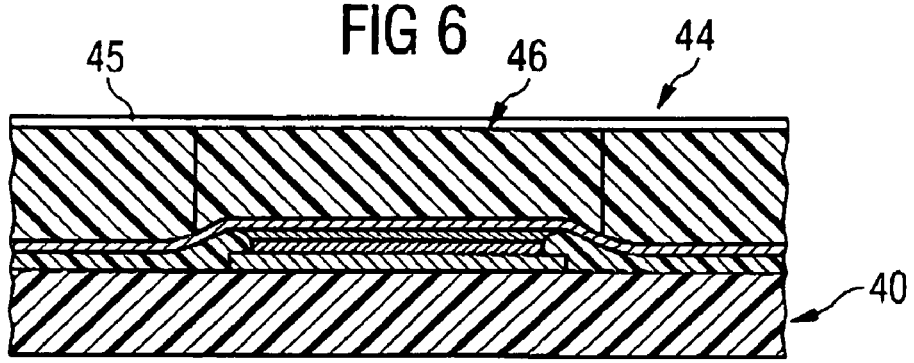
FIG. 6 shows the connecting surface area of FIG. 4 with a dielectric enclosing layer.

FIG. 6 shows an electrically non-conductive thick layer 44 made of a dielectric on the connecting surface area 39 and a photo-mask 45 arranged on the thick layer 44, enabling a spacer body 46 to be conformed in an etching procedure or similar out of the thick layer 44.

Figure 7:
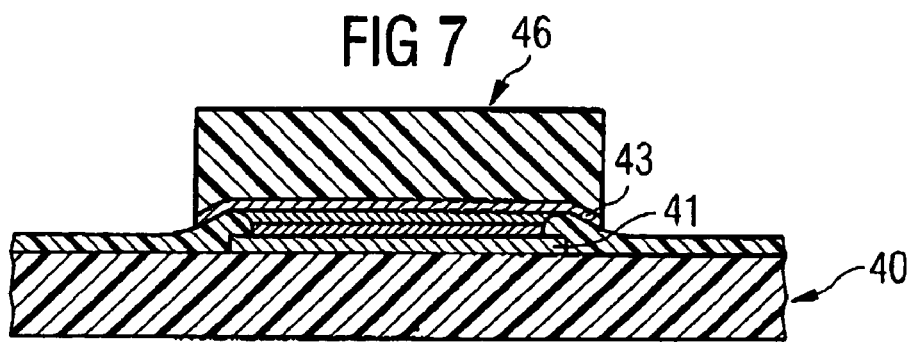
FIG. 7 shows the connecting surface area of FIG. 5 with a spacer body formed from a dielectric.

As is shown in FIG. 7, an etching procedure may be used to structure the spacer body 46 and at the same time remove the surface conductor layer 43 in the area surrounding the spacer body 46.

Figure 8:
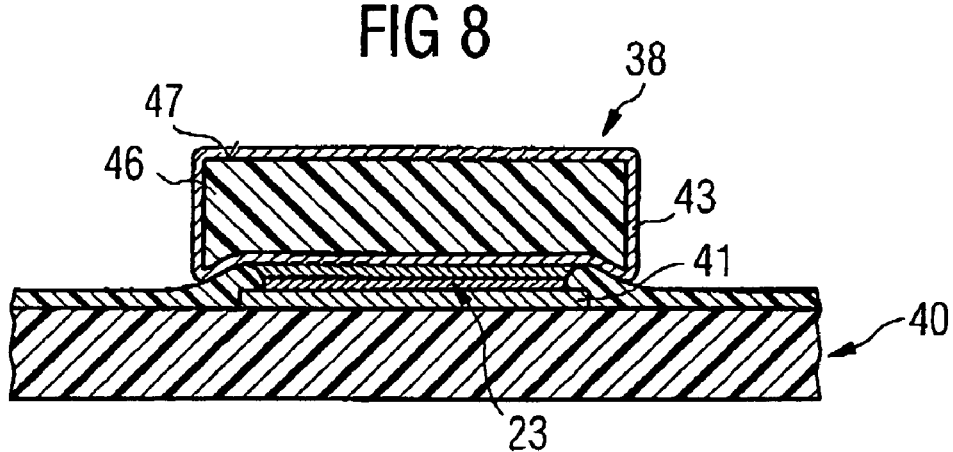
FIG. 8 shows the connecting surface area of FIG. 6 with another embodiment of a contact bump construction.

Finally, FIG. 8 shows the completed contact bump construction 38 with a surface conductor layer 43 extending beyond the outer periphery of the spacer body 46, and thereby bonding an upper side 47 of the spacer body 46 in electrically conductive manner with the connecting surface 41.

Figure 9:
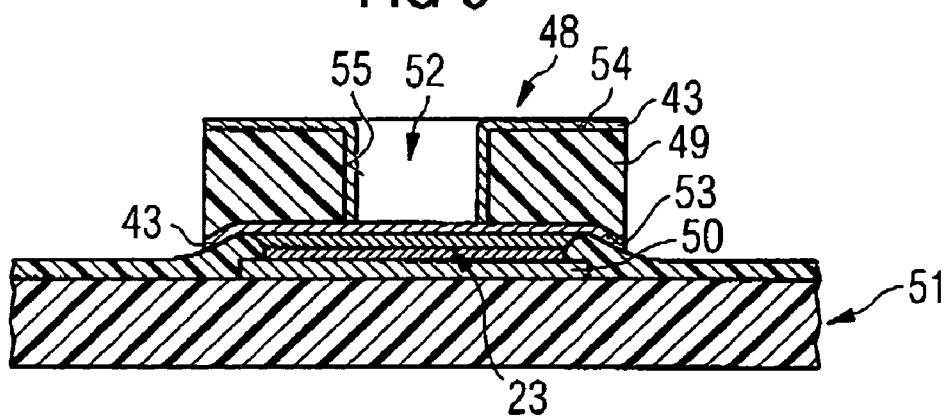
FIG. 9 shows a further embodiment of a contact bump construction with spacer body.
Figure 10:
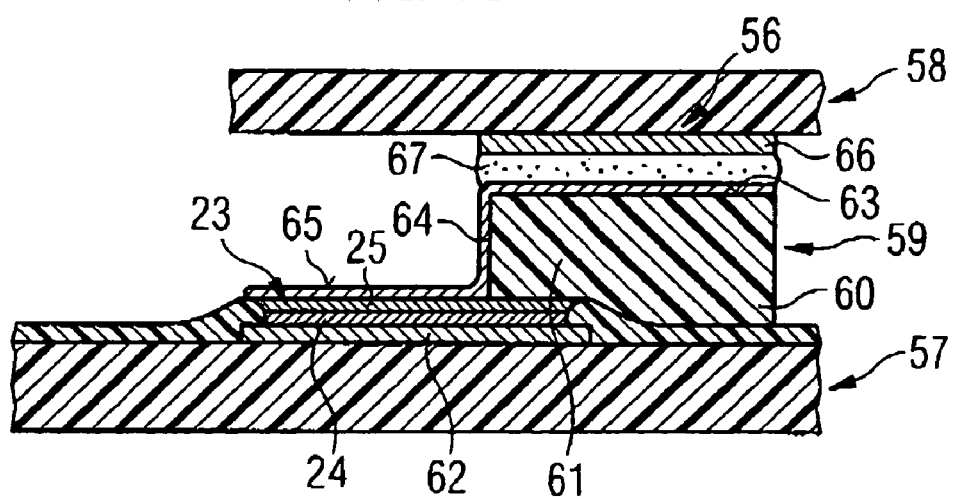
FIG. 10 shows a bonding configuration created using a further embodiment of a contact bump construction with spacer body between two substrates.

In the embodiments of the contact bump constructions shown in FIG. 8 and also in FIGS. 9 and 10, the connecting surfaces are made from aluminum, so that an intermediate metallization of the type described previously is practical for further contacting of the connecting surfaces. In the event that the connecting surfaces are made from copper, of course it is possible to make a contact without intermediate metallization.

In a further embodiment, FIG. 9 shows a contact bump construction 48 having a spacer body 49 that is arranged in a covering position with a connecting surface 50 of a substrate 51 and is furnished with a through-hole 52. The spacer body 49 is furnished with a surface conductor layer 43 both on its underside 53 and on its upper side 54, which permits an electrically conductive connection from the upper side 54 to the underside 53 through a hole wall 55 of the through-hole 52 and to the connecting surface 50 via the intermediate metallization 23.

In a different approach to that shown in FIG. 9, it is also possible to dispense with the arrangement of the surface conductor layer 43 on the upper side 54 of the spacer body 49, and to create a direct bonding configuration by using a suitable bonding substance to establish a direct contact with the surface conductor layer 43 arranged on the underside 53 or the intermediate metallization 23.

FIG. 10 shows a bonding configuration 56 between two substrates 57 and 58 using a further embodiment of a contact bump construction 59. The contact bump construction 59 includes a spacer body 60, which is located with a partial left area 61 in a overlapping position with a partial area 79 of a connecting surface 62 of the substrate 57. In the present case, the connecting surface 62 is made from aluminum and is furnished with an intermediate metallization 23 including a layer of nickel 24 and a layer of gold 25. In order to create an electrically conductive bond between an upper side 63 of the spacer body 60 and a second partial area 80 of the connecting surface 62, via the intermediate metallization 23, a surface conductor layer 65 extends from the upper side 63 over a peripheral area 64 of the spacer body 60 and over the intermediate metallization 23.

An anisotropic adhesive 67 is provided as bonding substance to assure a contact between the upper side 63 of the spacer body 60 furnished with the surface conductor layer 65, and a connecting surface 66 of the substrate 58.

From the representation of the bonding configuration 56 between the substrates 57 and 58 it is evident that with the contact bump construction 59 including the spacer body 60 it is possible to re-distribute or re-wire the contact surface structure of the substrate 57 so that it may be adapted to the contact surface structure or contact surface distribution of substrate 58.

Figure 11:
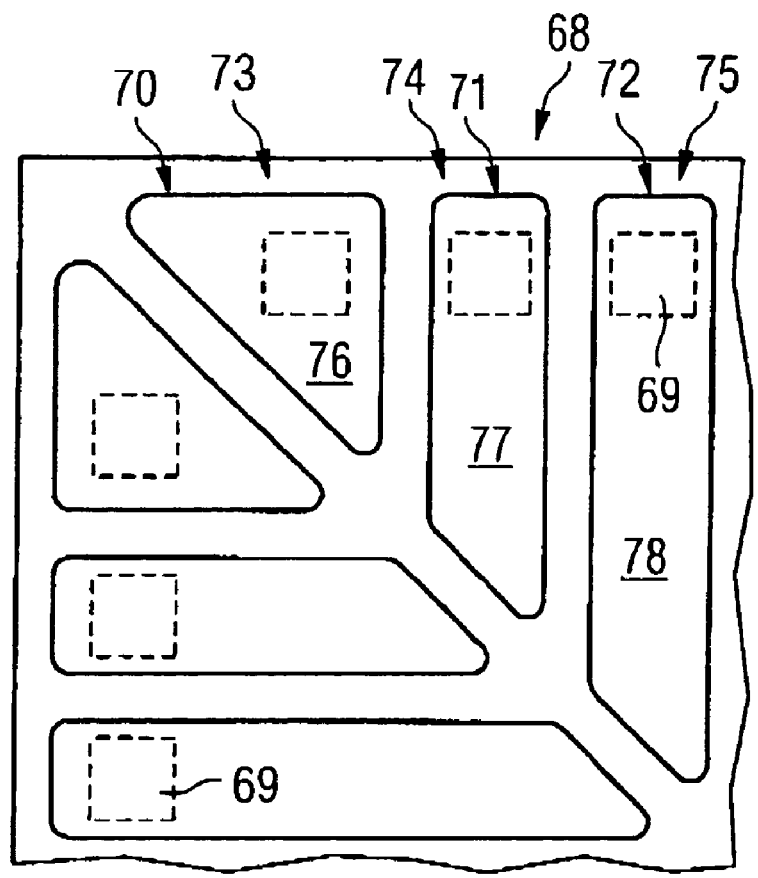
FIG. 11 shows a corner area of a substrate furnished with a plurality of contact bump constructions corresponding to FIG. 8.

FIG. 11, which shows a plan view of a corner area of a substrate 68, whose connecting surfaces 69 are furnished with contact bump constructions 73, 74, 75 with spacer bodies 70, 71 and 72, clearly reveals that, depending on the selection of their geometry, the spacer bodies 70, 71, 72 allow considerable enlargement of the contact surface area because of the size of their contact upper sides 76, 77, 78, which are considerably larger than the contact surfaces 69. In the present case, the contact bump constructions 73, 74, 75 may be conformed for example according to the type of contact bump construction 38 represented in FIG. 8.

By varying the geometry of the individual spacer bodies 70, 71, 72, it is possible to produce contact upper sides 76, 77, 78 having various surface shapes with corresponding surface areas. Contact surfaces that are enlarged in this way allow not only re-bonding and adaptation to a contact surface distribution of a counter substrate (not shown in FIG. 10) but also, because of the larger contact areas, compensation of intrinsic tolerance deviations in the contact surface distribution between the substrate and counter substrate. In addition, the enlarged contact areas of the contact upper sides 76, 77, 78 form an especially secure basis for the bonding configurations between substrates that are contacted with the adhesive.

Figure 12:
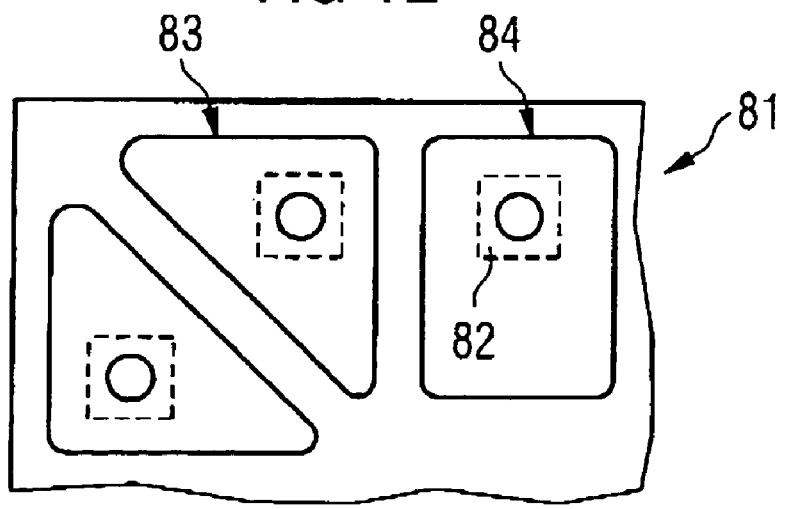
FIG. 12 shows a corner area of a substrate furnished with a plurality of contact bump constructions corresponding to FIG. 9.

FIG. 12, shows a plan view of a corner area of a substrate 81 whose connecting surfaces 82, unlike the substrate 68 with contact bump constructions 83, 84 in FIG. 11, are furnished with a contact bump construction 48 similar to the type shown in FIG. 9.

I claim:

1. The contact bump construction for the formation of elevated contact sites on connecting surfaces of a substrate, particularly chip connecting surfaces, with a spacer body, whose at least partly electrically conductive surface is connected to the assigned connecting surface of the substrate through an electrical conductor, the spacer body (46, 49, 60, 70, 71, 72) being constructed from a dielectric, and the conductor being formed at least partly as a surface conductor (43, 65) arranged on the surface of the spacer body, characterized in that the spacer body (60) is arranged with a partial area (61) on a first partial surface (79) of the connecting surface (62) and also extends beyond the connecting surface, and the surface conductor (65) extends from a second partial area (80) of the connecting surface to an upper side (63) of the spacer body.

2. The contact bump construction according to claim 1, characterized in that the spacer body (49) is furnished with a through-hole (52) that is arranged in a covering position with the connecting surface (50), and the surface conductor (43) is partly conformed as a through-hole contact.

3. The contact bump construction according to claim 1, characterized in that the spacer body (46) is arranged on the connecting surface (41) with intermediate arrangement of the surface conductor (43), and the surface conductor extends at least partly around the perimeter of the spacer body as far as an upper side (47) of the spacer body.

4. The contact bump construction according to one of claims 1 to 3, characterized in that the surface-conductor (43, 65) has at least in the areas beyond the connecting surface (41, 50, 62, 69) an adhesion agent layer as a carrier for a contact metallization of the conductor.

5. The contact bump construction according to claim 4, characterized in that the adhesion agent layer includes palladium.

6. The contact bump construction according to claim 5, characterized in that the contact metallization includes copper or a Cu/Ni alloy.

7. The contact bump construction according to one of claims 1 to 3, characterized in that the connecting surface (41, 50, 62, 69) and/or the surface of the spacer body (46, 49, 60, 70, 71, 72) is furnished with a contact metallization (23) containing Ni and Au.

* * * * *